United States Patent
Yamazaki et al.

(10) Patent No.: US 12,134,697 B2
(45) Date of Patent: *Nov. 5, 2024

(54) CURABLE HOT-MELT SILICONE COMPOSITION, CURED MATERIAL THEREOF, AND LAMINATE CONTAINING CURABLE HOT-MELT SILICONE COMPOSITION OR CURED MATERIAL THEREOF

(71) Applicant: DOW TORAY CO., LTD., Tokyo (JP)

(72) Inventors: Ryosuke Yamazaki, Ichihara (JP); Kouichi Ozaki, Ichihara (JP); Toru Imaizumi, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 181 days.

This patent is subject to a terminal disclaimer.

(21) Appl. No.: 17/788,121

(22) PCT Filed: Dec. 28, 2020

(86) PCT No.: PCT/JP2020/049074
§ 371 (c)(1),
(2) Date: Jun. 22, 2022

(87) PCT Pub. No.: WO2021/132710
PCT Pub. Date: Jul. 1, 2021

(65) Prior Publication Data
US 2023/0137947 A1    May 4, 2023

(30) Foreign Application Priority Data
Dec. 27, 2019 (JP) .................. 2019-238729

(51) Int. Cl.
C08L 83/04    (2006.01)
B32B 25/20    (2006.01)
(Continued)

(52) U.S. Cl.
CPC .............. *C08L 83/04* (2013.01); *B32B 25/20* (2013.01); *C08J 5/18* (2013.01); *C09J 7/10* (2018.01);
(Continued)

(58) Field of Classification Search
CPC ...... C08L 83/04; C08J 5/18; C09J 7/35; C09J 7/40
(Continued)

(56) References Cited

U.S. PATENT DOCUMENTS 5,100,976 A    3/1992   Hamada et al.
5,145,886 A    9/1992   Oxman et al.
(Continued)

FOREIGN PATENT DOCUMENTS

AU    618818 B2    1/1992
CN    101151328 A    3/2008
(Continued)

OTHER PUBLICATIONS

Machine assisted English translation of JP2016124967A obtained from https://patents.google.com/patent on Mar. 2, 2023, 19 pages.
(Continued)

*Primary Examiner* — Tahseen Khan
(74) *Attorney, Agent, or Firm* — Warner Norcross + Judd LLP (57) ABSTRACT

A curable hot-melt silicone composition that is less susceptible to curing inhibition and with excellent storage stability, and a sheet or film containing the same, is provided. The composition comprises: (A) a solid organopolysiloxane resin containing a specific ratio of (A1) an organopolysiloxane resin having a curing reactive functional group that contains a carbon-carbon double bond and containing 20 mol % or more of a Q unit, and (A2) an organopolysiloxane resin not having a curing reactive functional group that
(Continued)

contains a carbon-carbon double bond and containing 20 mol % or more of a Q unit; (B) a chain organopolysiloxane having a curing reactive functional group that contains at least two carbon-carbon double bonds; (C) an organohydrogenpolysiloxane resin having a mass loss ratio relative to pre-exposure of 10% or less after exposure to 100° C. for 1 hour under atmospheric pressure; and (D) a hydrosilylation reaction catalyst. The composition generally has hot-melt properties.

15 Claims, 1 Drawing Sheet

(51) Int. Cl.
*C08J 5/18* (2006.01)
*C09J 7/10* (2018.01)
*C09J 7/35* (2018.01)
*C09J 7/40* (2018.01)
*C09J 183/04* (2006.01)
C08G 77/12 (2006.01)
C08G 77/20 (2006.01)
H01L 23/29 (2006.01)

(52) U.S. Cl.
CPC . *C09J 7/35* (2018.01); *C09J 7/40* (2018.01); *C09J 183/04* (2013.01); B32B 2305/72 (2013.01); B32B 2307/732 (2013.01); B32B 2457/14 (2013.01); C08G 77/12 (2013.01); C08G 77/20 (2013.01); C08J 2383/07 (2013.01); C08J 2483/07 (2013.01); C08L 2205/025 (2013.01); C08L 2205/03 (2013.01); C09J 2483/00 (2013.01); H01L 23/293 (2013.01)

(58) Field of Classification Search
USPC .......................................................... 428/220
See application file for complete search history.

(56) References Cited

U.S. PATENT DOCUMENTS

| | | | |
|---|---|---|---|
| 5,169,727 A | 12/1992 | Boardman | |
| 5,357,007 A | 10/1994 | Wengrovius et al. | |
| 5,392,592 A | 2/1995 | Bozich et al. | |
| 5,977,243 A | 11/1999 | Barthel et al. | |
| 6,177,506 B1 | 1/2001 | Takahashi et al. | |
| 6,376,569 B1 | 4/2002 | Oxman et al. | |
| 6,379,792 B1 | 4/2002 | Isshiki et al. | |
| 6,433,055 B1 | 8/2002 | Kleyer et al. | |
| 8,124,689 B2 | 2/2012 | Loubert et al. | |
| 2002/0132891 A1 | 9/2002 | Azechi et al. | |
| 2004/0265599 A1 | 12/2004 | Ushio et al. | |
| 2006/0057779 A1 | 3/2006 | Sutoh et al. | |
| 2006/0094834 A1 | 5/2006 | Aoki et al. | |
| 2006/0270788 A1 | 11/2006 | Ozai et al. | |
| 2008/0319144 A1 | 12/2008 | Morita et al. | |
| 2009/0042043 A1 | 2/2009 | Joseph et al. | |
| 2009/0075009 A1 | 3/2009 | Fujisawa et al. | |
| 2009/0171013 A1 | 7/2009 | Taguchi et al. | |
| 2009/0281222 A1 | 11/2009 | Nishiumi et al. | |
| 2011/0104506 A1 | 5/2011 | Behl et al. | |
| 2011/0236666 A1 | 9/2011 | Hall et al. | |
| 2012/0139131 A1 | 6/2012 | Sugo et al. | |
| 2013/0183776 A1 | 7/2013 | Kashiwagi et al. | |
| 2013/0200554 A1 | 8/2013 | Mueller | |
| 2013/0274398 A1 | 10/2013 | Shiobara et al. | |
| 2014/0296468 A1 | 10/2014 | Kownacka et al. | |
| 2014/0377570 A1 | 12/2014 | Hirai et al. | |
| 2015/0115311 A1 | 4/2015 | Yoshida et al. | |
| 2015/0124338 A1 | 5/2015 | Mayumi et al. | |
| 2015/0183960 A1 | 7/2015 | Yamazaki et al. | |
| 2015/0315427 A1 | 11/2015 | Yoshida et al. | |
| 2015/0376482 A1 | 12/2015 | Bekemeier et al. | |
| 2016/0230005 A1 | 8/2016 | Mayumi et al. | |
| 2016/0311980 A1 | 10/2016 | Knoer | |
| 2017/0057980 A1 | 3/2017 | Boyer et al. | |
| 2017/0058103 A1 | 3/2017 | Fujisawa et al. | |
| 2017/0092822 A1 | 3/2017 | Amako et al. | |
| 2017/0166701 A1* | 6/2017 | Jo .......................... C08G 77/38 |
| 2017/0283613 A1 | 10/2017 | Mochizuki | |
| 2017/0355804 A1 | 12/2017 | Fujisawa et al. | |
| 2018/0105692 A1 | 4/2018 | Imaizumi et al. | |
| 2018/0208816 A1 | 7/2018 | Yamazaki | |
| 2018/0305547 A1 | 10/2018 | Dogen et al. | |
| 2019/0169398 A1 | 6/2019 | Yamazaki | |
| 2019/0169435 A1 | 6/2019 | Yamazaki | |
| 2019/0177488 A1 | 6/2019 | Yamazaki | |
| 2019/0276684 A1 | 9/2019 | Yamazaki et al. | |
| 2019/0367744 A1 | 12/2019 | Chevalier et al. | |
| 2020/0216671 A1 | 7/2020 | Matsuzaki et al. | |
| 2020/0224069 A1 | 7/2020 | Itoh et al. | |
| 2020/0354615 A1 | 11/2020 | Itoh et al. | |
| 2020/0392335 A1 | 12/2020 | Yamazaki | |
| 2021/0162704 A1 | 6/2021 | Sreeram et al. | |
| 2021/0179783 A1 | 6/2021 | Yoshitake | |
| 2021/0179849 A1 | 6/2021 | Yoshitake | |
| 2021/0189129 A1* | 6/2021 | Yamazaki ............... C08L 83/04 |
| 2021/0198489 A1 | 7/2021 | Yoshitake | |
| 2021/0269691 A1 | 9/2021 | Itoh et al. | |
| 2021/0284888 A1 | 9/2021 | Itoh et al. | |
| 2021/0292607 A1 | 9/2021 | Itoh et al. | |
| 2022/0002493 A1 | 1/2022 | Sugie et al. | |
| 2022/0048230 A1 | 2/2022 | Imaizumi et al. | |
| 2022/0064447 A1 | 3/2022 | Yamazaki | |
| 2022/0064491 A1 | 3/2022 | Yamazaki | |
| 2022/0089872 A1 | 3/2022 | Fukui et al. | |
| 2022/0169894 A1 | 6/2022 | Yamazaki et al. | |
| 2022/0186099 A1 | 6/2022 | Yamazaki et al. | |
| 2022/0195269 A1 | 6/2022 | Yamazaki | |
| 2022/0340756 A1 | 10/2022 | Nishijima et al. | |
| 2022/0403114 A1 | 12/2022 | Sugie et al. | |
| 2023/0044439 A1 | 2/2023 | Yamamoto et al. | |
| 2023/0137947 A1 | 5/2023 | Yamazaki et al. | |
| 2023/0151215 A1 | 5/2023 | Yamazaki et al. | |
| 2024/0002605 A1 | 1/2024 | Tanaka et al. | |
| 2024/0052106 A1 | 2/2024 | Yamazaki et al. | |
| 2024/0052220 A1 | 2/2024 | Yamamoto et al. | |

FOREIGN PATENT DOCUMENTS

| | | | |
|---|---|---|---|
| CN | 103849149 A | 6/2014 |
| CN | 104870585 A | 8/2015 |
| CN | 106459419 A | 2/2017 |
| CN | 106715593 A | 5/2017 |
| CN | 107429062 A | 12/2017 |
| CN | 108026373 A | 5/2018 |
| CN | 109844029 A | 6/2019 |
| EP | 1002834 A1 | 5/2000 |
| EP | 3954739 A1 | 2/2022 |
| EP | 4083140 A1 | 11/2022 |
| EP | 4130157 A1 | 2/2023 |
| EP | 4269503 A1 | 11/2023 |
| JP | H0275681 A | 3/1990 |
| JP | H0625602 A | 2/1994 |
| JP | H11158379 A | 6/1999 |
| JP | H11279182 A | 10/1999 |
| JP | H11335572 A | 12/1999 |
| JP | 2000063681 A | 2/2000 |
| JP | 2000198929 A | 7/2000 |
| JP | 2001019933 A | 1/2001 |
| JP | 2002155261 A | 5/2002 |
| JP | 2003176462 A | 6/2003 |
| JP | 2003226812 A | 8/2003 |
| JP | 2004043814 A | 2/2004 |
| JP | 2004307691 A | 11/2004 |
| JP | 2004315571 A | 11/2004 |
| JP | 2005007331 A | 1/2005 |
| JP | 2006188593 A | 7/2006 |
| JP | 2006274007 A | 10/2006 |
| JP | 2007119768 A | 5/2007 |

(56) References Cited

FOREIGN PATENT DOCUMENTS

| | | |
|---|---|---|
| JP | 2007231039 A | 9/2007 |
| JP | 2009503133 A | 1/2009 |
| JP | 2009132797 A | 6/2009 |
| JP | 2009155415 A | 7/2009 |
| JP | 2010047646 A | 3/2010 |
| JP | 2010047676 A | 3/2010 |
| JP | 2010509088 A | 3/2010 |
| JP | 2011525444 A | 9/2011 |
| JP | 2012017427 A | 1/2012 |
| JP | 2013076050 A | 4/2013 |
| JP | 2013523482 A | 6/2013 |
| JP | 2013147546 A | 8/2013 |
| JP | 2013221075 A | 10/2013 |
| JP | 2013221082 A | 10/2013 |
| JP | 2013222761 A | 10/2013 |
| JP | 2013232580 A | 11/2013 |
| JP | 5385247 B2 | 1/2014 |
| JP | 2014009322 A | 1/2014 |
| JP | 2015010132 A | 1/2015 |
| JP | 2015110752 A | 6/2015 |
| JP | 2015214637 A | 12/2015 |
| JP | 2016124967 A | 7/2016 |
| JP | 2017512224 A | 5/2017 |
| JP | 2017101137 A | 6/2017 |
| JP | 2017520918 A | 7/2017 |
| JP | 2017226724 A | 12/2017 |
| JP | 2018519369 A | 7/2018 |
| JP | 2018177993 A | 11/2018 |
| JP | 2019167832 A | 10/2019 |
| JP | 2019167833 A | 10/2019 |
| JP | 2021107149 A | 7/2021 |
| JP | 2021108319 A | 7/2021 |
| TW | 201439219 A | 10/2014 |
| WO | 2006104236 A1 | 10/2006 |
| WO | 2008056810 A1 | 5/2008 |
| WO | 2013051600 A1 | 4/2013 |
| WO | 2014002918 | 1/2014 |
| WO | 2014136805 A1 | 9/2014 |
| WO | 2015056483 A1 | 4/2015 |
| WO | 2015126780 A1 | 8/2015 |
| WO | 2015155949 A1 | 10/2015 |
| WO | 2016038836 A1 | 3/2016 |
| WO | 2016103654 A1 | 6/2016 |
| WO | 2017068762 A1 | 4/2017 |
| WO | 2018028792 A1 | 2/2018 |
| WO | 2018030286 A1 | 2/2018 |
| WO | 2018030287 A1 | 2/2018 |
| WO | 2018030288 A | 2/2018 |
| WO | 2018030288 A1 | 2/2018 |
| WO | 2018084012 A1 | 5/2018 |
| WO | 2018186161 A1 | 10/2018 |
| WO | 2018235491 A1 | 12/2018 |
| WO | 2018235492 A1 | 12/2018 |
| WO | 2019059351 A1 | 3/2019 |
| WO | WO-2019078140 A1 * | 4/2019 ............ B29C 35/02 |
| WO | 2019088067 A1 | 5/2019 |
| WO | 2016136243 A1 | 9/2019 |
| WO | 2019208756 A1 | 10/2019 |
| WO | 2020090797 A | 5/2020 |
| WO | 2020138055 A1 | 7/2020 |
| WO | 2020138409 A1 | 7/2020 |
| WO | 2020138410 A1 | 7/2020 |
| WO | 2020166692 A1 | 8/2020 |
| WO | 2020203304 A1 | 10/2020 |
| WO | 2020203307 A1 | 10/2020 |
| WO | 2021132710 A1 | 7/2021 |
| WO | 2021200643 A1 | 10/2021 |
| WO | 2022004463 A1 | 1/2022 |
| WO | 2022138336 A1 | 6/2022 |

OTHER PUBLICATIONS

International Search Report (with English translation) for PCT/JP2020/049074 dated Mar. 23, 2021, 7 pages.
Machine assisted English translation of JPH0625602 obtained from https://patents.google.com/patent on Nov. 11, 2022, 6 pages.
Machine assisted English translation of JP2019167832 obtained from https://patents.google.com/patent on Nov. 11, 2022, 11 pages.
Machine assisted English translation of JP2019167833 obtained from https://patents.google.com/patent on Nov. 11, 2022, 9 pages.
Machine assisted English translation of CN103849149A obtained from https://worldwide.espacenet.com/patent on Jan. 22, 2024, 11 pages.
Machine assisted English translation of JPH11158379A obtained from https://worldwide.espacenet.com/patent on Nov. 9, 2023, 11 pages.
Machine assisted English translation of CN106715593A obtained from https://patents.google.com/patent on Mar. 14, 2023, 26 pages.
Machine assisted English translation of JP2005007331A obtained from https://patents.google.com/patent on Mar. 14, 2023, 15 pages.
Machine assisted English translation of JP2004315571A obtained from https://patents.google.com/patent on Mar. 14, 2023, 15 pages.
Machine assisted English translation of JP2015010132A obtained from https://patents.google.com/patent on Mar. 14, 2023, 22 pages.
Machine assisted English translation of JP2004307691A obtained from https://patents.google.com/patent on Mar. 14, 2023, 11 pages.
Machine assisted English translation of JP2013222761A obtained from https://patents.google.com/patent on Mar. 15, 2023, 20 pages.
Machine assisted English translation of JP2018177993A obtained from https://patents.google.com/patent on Mar. 15, 2023, 36 pages.
International Search Report for PCT/JP2019/051394 dated Mar. 17, 2020, 2 pages.
Machine assisted English translation of WO2018235492A1 obtained from https://patents.google.com/patent on Oct. 4, 2021, 20 pages.
Machine assisted English translation of WO2016038836A1 obtained from https://patents.google.com/patent on Oct. 4, 2021, 18 pages.
Machine assisted English translation of WO2013051600A1 obtained from https://patents.google.com/patent on Oct. 4, 2021, 25 pages.
Machine assisted English translation of JP2007231039A obtained from https://patents.google.com/patent on Oct. 5, 2021, 7 pages.
International Search Report for PCT/JP2019/051393 dated Mar. 17, 2020, 3 pages.
International Search Report for PCT/JP2019/051392 dated Mar. 17, 2020, 2 pages.
International Search Report for PCT/JP2019/051391 dated Mar. 13, 2020, 3 pages.
International Search Report for PCT/JP2020/012028 dated Jun. 9, 2020, 3 pages.
Machine assisted English translation of JP2013221082A obtained from https://patents.google.com/patent on Oct. 27, 2021, 14 pages.
Machine assisted English translation of JP11335572A obtained from https://patents.google.com/patent on Oct. 27, 2021, 7 pages.
Machine assisted English translation of JPH11279182A obtained from https://patents.google.com/patent on Oct. 27, 2021, 8 pages.
Machine assisted English translation of JP2003176462A obtained from https://patents.google.com/patent on Oct. 27, 2021, 11 pages.
Machine assisted English translation of JP2009132797A obtained from https://patents.google.com/patent on Oct. 27, 2021, 9 pages.
Machine assisted English translation of JP2012017427A obtained from https://patents.google.com/patent on Oct. 27, 2021, 13 pages.
Machine assisted English translation of JP2000063681A obtained from https://patents.google.com/patent on Oct. 28, 2021, 8 pages.
International Search Report for PCT/JP2020/012027 dated Jun. 9, 2020, 3 pages.
International Search Report for PCT/JP2020/012030 dated Jun. 9, 2020, 2 pages.
International Search Report for PCT/JP2020/012029 dated Jun. 9, 2020, 3 pages.
International Search Report (with English translation) for PCT/JP2021/012840 dated Jun. 15, 2021, 6 pages.
English translation of International Search Report for PCT/JP2022/046146 dated Jan. 31, 2023, 2 pages.
Machine assisted English translation of JP2017101137A obtained from https://worldwide.espacenet.com/patent on Apr. 7, 2024, 18 pages.

(56) References Cited

OTHER PUBLICATIONS

Machine assisted English translation of JP2021108319A obtained from https://worldwide.espacenet.com/patent on Mar. 12, 2024, 73 pages.
Machine assisted English translation of WO2020138055A1 obtained from https://worldwide.espacenet.com/patent on Apr. 7, 2024, 43 pages.
English translation of International Search Report for PCT/JP2019/042320 dated Mar. 24, 2020, 2 pages.
Machine assisted English translation of JP2010047676A obtained from https://patents.google.com/patent on Aug. 19, 2024, 8 pages.
Machine assisted English translation of JP2015214637A obtained from https://patents.google.com/patent on Jul. 21, 2021, 11 pages.
Machine assisted English translation of JP2017101137A obtained from https://patents.google.com/patent on Jul. 21, 2021, 11 pages.
English translation of International Search Report for PCT/JP2021/046092 dated Feb. 8, 2022, 2 pages.
English translation of International Search Report for PCT/JP2021/046093 dated Mar. 15, 2022, 2 pages.
Dowsil™ EA-4600 Silicone Adhesive Application Guide for PCT Device Assemblies (Dow Toray Co., Ltd. publication, Form No. 1-3497-42-1120 S2D, 2020).
Machine assisted English translation of WO2019208756A1 obtained from https://worldwide.espacenet.com/patent on Dec. 21, 2023, 32 pages.
Machine assisted English translation of JP2017226724A obtained from https://patents.google.com/patent on Aug. 14, 2024, 14 pages.
Machine assisted English translation of JP2003226812A obtained from https://patents.google.com/patent on Aug. 14, 2024, 11 pages.
Machine assisted English translation of JP2010047646A obtained from https://patents.google.com/patent on Aug. 14, 2024, 9 pages.

\* cited by examiner

CURABLE HOT-MELT SILICONE COMPOSITION, CURED MATERIAL THEREOF, AND LAMINATE CONTAINING CURABLE HOT-MELT SILICONE COMPOSITION OR CURED MATERIAL THEREOF

CROSS-REFERENCE TO RELATED APPLICATIONS

This application is the U.S. National Stage of International Application No. PCT/JP2020/049074 filed on 28 Dec. 2020, which claims priority to and all advantages of Japanese Patent Application No. 2019-238729 filed on 27 Dec. 2019, the contents of which are incorporated herein by reference.

TECHNICAL FIELD

The present invention relates to a hot-melt curable silicone composition that is less susceptible to curing inhibition and has excellent storage stability, a cured product thereof, and a laminate body containing the composition or cured product.

BACKGROUND ART

Curable silicone compositions can be cured to form cured products having excellent heat resistance, cold resistance, electrical insulation, weather resistance, water repellency, and transparency, and are utilized in a wide range of industrial fields. In general, a cured product of such curable silicone compositions is less prone to discoloration compared with other organic materials and has reduced deterioration of physical properties overtime, and therefore is also suitable as a sealing agent for optical materials and semiconductor devices.

The present applicant has proposed, in Patent Document 1 and Patent Document 2, a so-called hot-melt curable granular silicone composition and a reactive silicone composition for molding. These silicone compositions are made up of so-called phenyl silicone resins, which have the advantages of superior hot-melt properties and superior hardness and strength of the cured product when compared to methyl silicone resins.

On the other hand, in recent years, optical semiconductor devices have become smaller and higher output, and when these hot-melt curable granular silicone compositions and the like are applied, especially under high temperatures of 200° C. or higher, coloring derived from phenyl silicone resin may occur, and in particular, in the field of reflective materials, light reflectance may decrease. Therefore, there is a high need for a silicone composition that satisfies the requirements for higher heat resistance and coloring resistance while achieving hot-melt properties and preferred mechanical strength for a cured product after molding.

Here, in Patent Document 3, the applicant also discloses a transparent hot-melt curable silicone sheet that uses methyl silicone resin. However, there is a problem where if a compound containing phosphorus or nitrogen is present in a substrate or the like, these compositions are susceptible to curing inhibition, and essentially do not cure, or even require a very long period of time to cure. Furthermore, these curable silicone sheets have a problem where it is difficult to produce a sheet with a film thickness of 100 μm or more using the disclosed production method.

RELATED ART DOCUMENTS

Patent Documents

Patent Document 1: International Publication WO 2016/136243 Pamphlet
Patent Document 2: Japanese Unexamined Patent Application 2014-009322
Patent Document 3: Japanese PCT Patent Application 2017-512224

SUMMARY OF THE INVENTION

Problem to be Solved by the Invention

An object of the present invention is to provide a hot-melt curable silicone composition that is less susceptible to curing inhibition and has excellent storage stability, and a cured product thereof. Furthermore, the present invention provides a sheet or film containing the curable silicone composition, and particularly a sheet or film that does not have a void, is substantially flat, and has a film thickness of 10 to 1000 μm, as well as a releasable laminate body including the sheet or film containing the curable silicone composition. Furthermore, yet another object of the present invention is to provide: a member for a semiconductor device including a cured product of the curable silicone composition; a semiconductor device having the cured product; and a method of molding a cured product.

Means for Solving the Problem

As a result of extensive studies, the present inventors discovered that the aforementioned problems can be resolved by a curable silicone composition having hot-melt properties as a whole, obtained by using, at a prescribed amount, (A) a combination of (A1) an organopolysiloxane resin that is solid at 25° C., having a curing reactive functional group containing a carbon-carbon double bond in a molecule, containing a siloxane unit expressed by $SiO_{4/2}$ making up at least 20 mol % or more of all siloxane units, and not having hot-melt properties alone and (A2) an organopolysiloxane resin that is solid at 25° C., not having a curing reactive functional group containing a carbon-carbon double bond in a molecule, containing a siloxane unit expressed by $SiO_{4/2}$ making up at least 20 mol % or more of all siloxane units, and not having hot-melt properties alone, at a mass ratio of (A1):(A2)=0:100 to 90:10, (B) a straight-chain or branched-chain organopolysiloxane that is a liquid or has plasticity at 25° C., having a group containing a carbon-carbon double bond, (C) an organohydrogenpolysiloxane having a specific chemical structure and having a mass loss ratio relative to pre-exposure of 10% or less after exposure to 100° C. for 1 hour under atmospheric pressure, particularly under 1 atm, and (D) a hydrosilylation reaction catalyst, thereby achieving the present invention.

Note that in the present invention, atmospheric pressure refers to the atmospheric pressure in the environment where the curable silicone composition is handled in a laboratory, factory, or the like, and although not limited to a specific pressure, usually refers to an atmospheric pressure ranging from 1 atm (1013.25 hPa) to minus 100 hPa to plus 100 hPa, and particularly 1 atm (1013.25 hPa).

Furthermore, in the present specification, room temperature refers to a temperature of an environment in which a person handling the curable silicone composition of the present invention is present. Room temperature typically refers to 0° C. to 40° C., particularly refers to 15 to 30° C., and more particularly refers to 18° C. to 25° C.

The present invention also relates to a sheet or film containing the curable hot-melt silicone composition described above. The sheet or film is characterized in that components forming the curable hot-melt silicone composition are melt-kneaded under vacuum or reduced pressure within a temperature range of 50 to 150° C., and then molded into a sheet or film. Herein, in general, "sheet" refers to a sheet with a thickness of 250 µm or more, and "film" refers to a film with a thickness of 250 µm or less. However, for simplicity of description, the film and sheet may be simply collectively referred to as "sheet" in the present specification.

Effects of the Invention

The curable silicone composition of the present invention has hot-melt properties, is less susceptible to curing inhibition, has excellent storage stability, and has excellent handling workability and curing properties in overmold molding or the like. Furthermore, the curable silicone composition has high thixotropy at temperatures exceeding 100° C., and no liquid dripping occurs even after performing thermocompression bonding on a substrate and then performing thermosetting in an oven or the like. Furthermore, the curable silicone composition of the present invention has excellent flexibility and stress relaxation properties in a cured product. Therefore, a laminate body that does not warp or the like can be obtained even when bulk sealing is performed on a large-area substrate. Furthermore, the curable silicone composition of the present invention can be manufactured simply by a simple mixing step, and therefore can be efficiently manufactured. Furthermore, the present invention can provide such a curable silicone composition in the form of a sheet or film with a thickness of 10 to 1000 µm without a void or the like, or in the form of a releasable laminate body containing such a curable silicone composition sheet or film as well as a release sheet or film. Furthermore, the sheet or film containing the curable silicone composition of the present invention or the releasable laminate body containing the sheet or film can be used after cutting to a desired size, if necessary, in a manufacturing process or the like of an electronic component such as a semiconductor device, and can be applied to an industrial production process such as batch sealing, batch adhering, and the like to a large-area substrate.

BRIEF DESCRIPTION OF THE DRAWINGS

FIG. 1 is a graph showing variations in the storage elastic modulus and tanδ due to the temperature of a cured product obtained by curing the curable hot-melt silicone composition (upper side of graph) of the present invention and a general silicone cured product (lower side of graph). When dynamic viscoelasticity is measured while changing the temperature, general silicone cured products exhibit a sharp glass transition at a certain temperature, depending on the network structure and the type of functional group. In other words, the curve of tanδ, which is the ratio of storage elastic modulus to loss elastic modulus, has a sharp peak at a certain temperature. In general, the tanδ value being high means that applied forces are dispersed (relieved), and therefore, it can be said that materials with a high tanδ have superior stress relaxation properties. Herein, a cured product obtained by curing the curable hot-melt silicone composition used in a multi-layer laminate body according to the present invention preferably does not exhibit a sharp tanδ peak at a certain temperature but rather shows characteristics of a high tanδ value over a wide range of temperature (FIG. 1).

FIG. 2 is a schematic diagram of a twin-screw extruder used in the examples.

DESCRIPTION OF THE PREFERRED EMBODIMENT

Embodiments of the present invention will be described below in detail. The present invention is not limited by the following embodiments, and various types of modifications may be made within the scope of the gist of the present invention.

In the present invention, unless otherwise stated, "having hot-melt properties" means the softening point of a composition is between 50 and 200° C., and the composition has melt viscosity at 150° C. (preferably, melt viscosity of less than 1000 Pa-s) and has flowable properties. Therefore, in the present specification, the curable silicone composition having hot-melt properties of the present invention is also referred to as a curable hot-melt silicone composition.

[Hot-Melt Properties and Composition of Curable Silicone Compositions]

The curable silicone composition according to the present invention has hot-melt properties as a whole and can flow under heated conditions. In particular, the curable silicone composition of the present invention preferably has a softening point of 50° C. or higher and melt viscosity at 150° C. (preferably, a melt viscosity that is less than 1,000 Pa-s). Note that in the present invention, the composition as a whole only needs have hot-melt properties, and individual components forming the composition do not need to have hot-melt properties.

More specifically, the curable silicone composition according to the present invention, in other words, the curable hot-melt silicone composition, contains the following components (A), (B), (C), and (D) as essential components in the following proportions, and exhibits hot-melt properties as a whole.

(A) 100 mass parts of an organopolysiloxane resin containing the following component (A1) and component (A2) at a mass ratio of 0:100 to 90:10, and preferably 0:100 to 75:25;

(A1) an organopolysiloxane resin that is solid at 25° C., having a curing reactive functional group containing a carbon-carbon double bond in a molecule, containing a siloxane unit as expressed by $SiO_{4/2}$ making up at least 20 mol % or more of all siloxane units, and not having hot-melt properties alone; and (A2) an organopolysiloxane resin that is solid at 25° C., not having a curing reactive functional group containing a carbon-carbon double bond in a molecule, containing a siloxane unit as expressed by $SiO_{4/2}$ making up at least 20 mol % or more of all siloxane units, and not having hot-melt properties alone;

(B) 10 to 100 mass parts of a straight chain or branched organopolysiloxane that is liquid or has plasticity at 25° C., having a curing reactive functional group containing at least two carbon-carbon double bonds in a molecule;

(C) an organohydrogenpolysiloxane expressed by the following average compositional formula (1):

$$(R^4_3SiO_{1/2})_a(R^5_2SiO_{2/2})_b(R^5SiO_{3/2})_c(SiO_{4/2})_d \tag{1}$$

(Where $R^4$ and $R^5$ each independently represent an unsubstituted or substituted monovalent hydrocarbon group containing an aliphatic unsaturated bond with 1 to 12 carbon atoms, at least two of all $R^4$s represent hydrogen atoms, and a, b, c, and d represent numbers that satisfy conditions of $0.01 \leq a \leq 0.6$, $0 \leq b$, $0 \leq c \leq 0.9$, $0 \leq d \leq 0.9$, and $a+b+c+d=1$ and $c+d \geq 0.2$.)

and having a mass loss ratio relative to pre-exposure of 10% or less after exposure to 100° C. for 1 hour under atmospheric pressure, and particularly under 1 atm (at amount where the number of hydrogen atoms bonded to a silicon atom per alkenyl group bonded to a silicon atom included in the entire composition is 0.5 to 20.0); and (D) a sufficient amount of a hydrosilylation reaction catalyst to crosslink the present composition.

Furthermore, the curable silicone composition above may contain the following component (E) as an optional component:

(E) Curing retarder for a hydrosilylation reaction with a boiling point of 200° C. or higher under atmospheric pressure, particularly at 1 atm.

Furthermore, the curable hot-melt silicone composition of the present invention may have other additives known in the art, added within a scope where the properties intended by the present invention can be maintained.

Note that the shape of the curable hot-melt silicone composition of the present invention is not particularly limited, but may be, for example, in a form molded into a sheet or film, with the sheet or film form being particularly preferred. Components and optional components included in the composition of the present invention will be described below.

(Component (A))

The curable silicone composition according to the present invention has, as component (A), a combination of an organopolysiloxane resin that is solid at 25° C., having a curing reactive functional group that contains a carbon-carbon double bond, containing a siloxane unit expressed by $SiO_{4/2}$ making up at least 20 mol % or more of all siloxane units, and not exhibiting hot-melt properties alone, and an organopolysiloxane resin that is a solid at 25° C., not having a curing reactive functional group that contains a carbon-carbon double bond, containing a siloxane unit expressed by $SiO_{4/2}$ making up at least 20 mol % or more of all siloxane units, and not exhibiting hot-melt properties alone, at a mass ratio of 0:100 to 90:10, and preferably 0:100 to 75:25. The organopolysiloxane resin may further contain a siloxane unit expressed by $R_3SiO_{1/2}$, $R_2SiO_{2/2}$, or $RSiO_{3/2}$ (R represents a monovalent organic group, and particularly a monovalent hydrocarbon group with 1 to 10 carbon atoms), or a hydroxyl group, or an alkoxy group expressed by $R^2O_{1/2}$ ($R^2$ represents a hydrogen atom or an alkyl group having 1 to 10 carbon atoms), but preferably includes siloxane units expressed by $SiO_{4/2}$ making up at least 20 mol % or more, preferably 40 mol % or more, and particularly preferably within a range of 40 to 90 mol % of all siloxane units. If the amount of the siloxane units expressed by $SiO_{4/2}$ is less than 20 mol %, a technical effect of the present invention may not be achieved even if the organopolysiloxane resin contains a large amount of other branched siloxane units (for example, $RSiO_{3/2}$), for example.

The organopolysiloxane resin of component (A) is preferably an organopolysiloxane resin mixture containing:

(A1) an organopolysiloxane resin that is solid at 25° C., having a curing reactive functional group containing a carbon-carbon double bond in a molecule, containing a siloxane unit expressed by $SiO_{4/2}$ making up at least 20 mol % or more of all siloxane units, and not having hot-melt properties alone; and (A2) an organopolysiloxane resin that is solid at 25° C., not having a curing reactive functional group containing a carbon-carbon double bond in a molecule, containing a siloxane unit expressed by $SiO_{4/2}$ making up at least 20 mol % or more of all siloxane units, and not having hot-melt properties alone, at a mass ratio of 0:100 to 90:10, and preferably 0:100 to 75:25 (component (A1):component (A2)).

Note that component (A1) is an optional component in component (A), and use of only component (A2) described later as component (A) is feasible.

Note that the curing reactivity means that the composition is able to react with an organohydrogensiloxane of component (C) by a hydrosilylation reaction, and thereby the entire composition can be cured.

Although component (A) described above does not have hot-melt properties alone, the composition of the present invention can have hot-melt properties as a whole by using component (A) in combination with component (B) described later in a prescribed quantitative ratio range.

[Organopolysiloxane Resin (A1) Having a Curing Reactive Functional Group]

Component (A1) described above is one base compound of the present composition, and is an organopolysiloxane resin that contains a siloxane unit expressed by $SiO_{4/2}$ making up at least 20 mol % or more of all siloxane units, has no hot-melt properties alone, and has a curing reactive functional group containing a carbon-carbon double bond in a molecule.

Component (A1) must have a curing reactive group having a carbon-carbon double bond in a molecule. Such a curing reactive group is a hydrosilylation reactive functional group, which can form a cured product by a hydrosilylation cross-linking reaction with component (C). Such a curing reactive group is particularly preferably an alkenyl group, and more particularly preferably a vinyl group or hexenyl group.

Preferably, a functional group bonded to a silicon atom in the organopolysiloxane resin of component (A1) is a group selected from a methyl group, a vinyl group, or other alkenyl group. It is preferable that 70 to 99 mol % of all organic groups bonded to silicon atoms are methyl groups, it is more preferable that 80 to 99 mol % of all organic groups bonded to silicon atoms are methyl groups, and it is particularly preferable that 88 to 99 mol % of all organic groups bonded to silicon atoms are methyl groups. Other organic groups bonded to a silicon atom are particularly preferably a vinyl group or other alkenyl group. In such a range, component (A1) is not hot-meltable alone, but is useful as a component that is particularly excellent in coloring resistance and the like at the high temperatures of a cured product obtained from the curable silicone composition of the present invention. Note that the organopolysiloxane resin of component (A1) may contain a small amount of a hydroxyl group or alkoxy group.

Component (A1) is an organopolysiloxane resin that is solid in a solvent-free state, and contains a siloxane unit expressed by $SiO_{4/2}$ making up at least 20 mol % or more of all siloxane units in a molecule. Preferably, the $SiO_{4/2}$ unit is at least 40 mol %, more preferably 50 mol % or more, and particularly preferably within a range of 50 to 90 mol % of all siloxane units. Furthermore, an organic group R provided by the organopolysiloxane resin of component (A1) is a monovalent organic group, suitably a functional group selected from a monovalent hydrocarbon group having 1 to 10 carbon atoms, particularly an alkyl group having 1 to 10 carbon atoms, such as a methyl group or the like, and an alkenyl group, and from the perspective of technical effectiveness, group R preferably does not substantially contain a phenyl group or other aryl group.

Preferably, component (A1) is (A1-1) an organopolysiloxane resin that is a solid at 25° C., not having hot-melt properties alone, expressed by the following average unit formula:

(where each $R^1$ independently represents a monovalent hydrocarbon group with 1 to 10 carbon atoms, but 1 to 12 mol % of all R's in a molecule represents an alkenyl group; each $R^2$ represents a hydrogen atom or an alkyl group with 1 to 10 carbon atoms; and a, b, c, d, and e represent numbers that satisfy $0.10 \leq a \leq 0.60$, $0 \leq b \leq 0.70$, $0 \leq c \leq 0.80$, $0 \leq d \leq 0.65$, $0 \leq e \leq 0.05$, but $c+d>0.20$ and $a+b+c+d=1$).

In the average unit formula described above, each $R^1$ independently represents a monovalent hydrocarbon group with 1 to 10 carbon atoms, and each $R^1$ preferably represents a functional group selected from methyl groups and other alkyl groups with 1 to 10 carbon atoms and vinyl groups, hexenyl groups, and other alkenyl groups. From the perspective of a technical effect of the present invention, $R^1$ preferably is substantially free of phenyl groups and other aryl groups.

[Component (A2)]

Component (A2) is one base compound of the present composition, is an organopolysiloxane resin that is solid at 25° C., not having hot-melt properties alone and not containing a curing reactive functional group, and is a component for achieving hot-melt properties of the curable silicone composition as a whole and excellent stress relaxation properties of a cured product obtained by curing the curable silicone composition through use in combination with component (A1) and component (B) described above within a prescribed quantitative range.

Component (A2) is an organopolysiloxane resin which, similar to component (A1), is a solid at 25° C. and contains a siloxane unit expressed by $SiO_{4/2}$ making up at least 20 mol % or more of all siloxane units, but does not have a curing reactive functional group containing at least one carbon-carbon double bond in a molecule. In other words, component (A2) does not contain an alkenyl group such as a vinyl group or the like as a functional group in the organopolysiloxane resin. Examples of groups provided by the organopolysiloxane resin of component (A2) include monovalent hydrocarbon groups with 1 to 10 carbon atoms, and particularly methyl groups and other alkyl groups with 1 to 10 carbon atoms. The organopolysiloxane resin must be substantially free of phenyl groups or other aryl groups. For example, the ratio of aryl groups in all organic groups bonded to silicon atoms is 5 mol % or less, and more preferably 2 mol % or less. It is particularly preferable that no aryl groups are included at all.

Preferably, the component (A2) is (A2-1) an organopolysiloxane resin that does not have hot-melt properties alone, expressed by the following average unit formula:

(where each $R^3$ independently represents a monovalent hydrocarbon group with 1 to 10 carbon atoms and that does not contain a carbon-carbon double bond; $R^2$ represents a hydrogen atom with an alkyl group with 1 to 10 carbon atoms; and f, g, h, i, and j represent numbers that satisfy $0.35 \leq f \leq 0.55$, $0 \leq g \leq 0.20$, $0 \leq h \leq 0.20$, $0.45 \leq i \leq 0.65$, $0 \leq j \leq 0.05$, and $f+g+h+i=1$).

In the average unit formula above, each $R^3$ independently represents a monovalent hydrocarbon group with 1 to 10 carbon atoms and not containing a carbon-carbon double bond. It is particularly preferable from the perspective of industrial production and a technical effect of the invention that 70 mol % or more, and preferably 88 mol % or more of all $R^3$s in one molecule are methyl groups or other alkyl groups with 1 to 10 carbon atoms. On the other hand, $R^3$ is preferably substantially free of phenyl groups and other aryl groups.

[Removal of Volatile Low Molecular Weight Components in Component (A)]

For component (A1) and the component (A2), volatile low molecular weight components are produced in each production process. Specifically, the volatile low molecular weight components appear as byproducts from polymerizing the organopolysiloxane resins that have a $M_4Q$ structure containing an M unit ($R^3_3SiO_{1/2}$) and a Q unit ($SiO_{4/2}$). This structure has an effect of significantly reducing the hardness of the cured product obtained from the curable silicone composition of the present invention, but the $M_4Q$ structure is highly compatible with the organopolysiloxane resin and is difficult to remove under drying conditions that would remove an organic solvent. If a curable silicone composition containing the $M_4Q$ structure is molded together with a substrate of a semiconductor or the like, and then exposed to a high temperature to remove the $M_4Q$ structure, the volume of a cured product resulting from the curable silicone composition may decrease and the hardness of the cured product may significantly increase, resulting in changes in dimensions of a molded product, warping, and the like. Therefore, in order to apply the curable silicone compositions of the present invention to applications laminated with a substrate of a semiconductor or the like, the $M_4Q$ structure is preferably removed from the organopolysiloxane resin prior to a molding step of curing with the curable silicone composition by laminating with a substrate, and, if possible, prior to preparing the curable silicone composition.

From the perspective of efficiently producing the curable hot-melt silicone composition of the present invention, a step is preferably performed of adding component (B), described later, to component (A2) or a mixture of component (A1) and component (A2) dissolved in an organic solvent, feeding the mixture in a liquid state into a twin-screw extruder set at 200° C. or higher, and then removing the $M_4Q$ structure or other volatile components together with the organic solvent. This method enables obtaining a mixture of component (A) and component (B) having hot-melt properties, which can be used for kneading in the remaining components included in the curable silicone composition in a process described later.

[Mass Ratio of Component (A1) and Component (A2) in Component (A)]

In order for the present composition as a whole to have hot-melt properties, component (A2) or a mixture of component (A1) and component (A2) must be mixed together with component (B) to be described later at a prescribed ratio. The ratio of component (A1) and component (A2) may be within a range of 0:100 to 90:10, is preferably within a range of 0:100 to 85:25, is more preferably 0:100 to 80:20, and is particularly preferably 0:100 to 75:25. Component (A2) itself does not have curing properties due to not having a curing reactive functional group. However, by using component (A2) in combination with component (A1) in the present composition, it is possible to adjust to a certain degree the storage elastic modulus, loss elastic modulus, and tanδ calculated from the ratio therefrom, thereby achieving an elastic modulus, flexibility, and stress relaxation properties that are suitable for a cured product. Furthermore, a curable hot-melt silicone composition with desired properties in the present invention can be prepared by combining component (A2) with component (B) without component (A1).

(Component (B))

Component (B) is one base compound of the present curable silicone composition, is a straight-chain or branched-chain organopolysiloxane that is liquid or has plasticity at 25° C., and has a curing reactive functional group containing at least two carbon-carbon double bonds in a molecule. Such a curing reactive chain organopolysiloxane, when mixed with the solid organopolysiloxane resin of component (A) described above, can exhibit hot-melt properties as an entire composition.

Component (B) must have a curing reactive functional group having a carbon-carbon double bond in a molecule. Such a curing reactive functional group is hydrosilylation reactive, and forms a cured product by a cross-linking reaction with another component.

Such a curing reactive functional group is preferably a vinyl group or hexenyl group, similar to that provided by component (A1).

Component (B) is a straight-chain or branched-chain organopolysiloxane that is liquid or has plasticity at 25° C. (room temperature), and when mixed with component (A1) in a solid state at room temperature, the composition as a whole can exhibit hot-melt properties. A chemical structure of the organopolysiloxane of component (B) may be a straight chain organopolysiloxane, or a branched-chain organopolysiloxane having a small number of branched siloxane units (for example, a T unit expressed by general formula: $R^4SiO_{3/2}$ (where $R^4$ independently represents a monovalent hydrocarbon group with 1 to 10 carbon atoms) or a Q unit expressed by $SiO_{4/2}$), but is preferably (B1) a straight-chain diorganopolysiloxane expressed by the following structural formula:

$R^4{}_3SiO(SiR^4{}_2O)_kSiR^4{}_3$ (where each $R^4$ independently represents a monovalent hydrocarbon group with 1 to 10 carbon atoms, but at least two of the $R^4$s in one molecule represent alkenyl groups, and k represents a number from 20 to 5,000).

A straight-chain diorganopolysiloxane having an alkenyl group, and particularly preferably a vinyl group at both ends of a molecular chain is preferred. Particularly preferably, a vinyl group or other alkenyl group is preferred at both ends of a molecular chain, with the rest of $R^4$ being a methyl group.

In the formula above, k represents a number between 20 and 5,000, preferably between 30 and 3,000, and particularly preferably between 45 and 800. If k is at or above the lower limit of the aforementioned range, a curable silicone composition having little stickiness at room temperature can be obtained. On the other hand, if k is at or below the upper limit of the aforementioned range, the curable silicone composition as a whole can achieve a favorable hot-melt performance.

Herein, in order to exhibit hot-melt properties as an entire composition, component (B), which is a straight-chain or branched-chain organopolysiloxane, relative to 100 mass parts of component (A), which is an organopolysiloxane resin, is within a range of 10 to 100 mass parts, is preferably within a range of 10 to 70 mass parts, and is more preferably within a range of 15 to 50 mass parts.

(Component (C))

Component (C) is an organohydrogenpolysiloxane having a hydrogen atom bonded to a silicon atom capable of cross-linking with carbon-carbon double bonds in component (A) and component (B) described above in the presence of a catalyst for a hydrosilylation reaction, and specifically is an organohydrogenpolysiloxane expressed by the following average compositional formula (1):

$$(R^4{}_3SiO_{1/2})_a(R^5{}_2SiO_{2/2})_b(R^5SiO_{3/2})_c(SiO_{4/2})_d \quad (1)$$

(Where $R^4$ independently represents an unsubstituted or substituted monovalent hydrocarbon group that does not contain a hydrogen atom or an aliphatic unsaturated bond with 1 to 12 carbon atoms, $R^5$ independently represents an unsubstituted or substituted monovalent hydrocarbon group containing an aliphatic unsaturated bond with 1 to 12 carbon atoms, at least two of all $R^4$s represent hydrogen atoms, and a, b, c, and d represent numbers that satisfy conditions of $0.01 \leq a \leq 0.6$, $0 \leq b$, $0 \leq c \leq 0.9$, $0 \leq d \leq 0.9$, and $a+b+c+d=1$ and $c+d \leq 0.2$).

Furthermore, the organohydrogenpolysiloxane has a mass loss ratio relative to pre-exposure of 10% or less after exposure to 100° C. for 1 hour under atmospheric pressure.

In the formula above, each $R^4$ represent the same or different hydrogen atom or monovalent hydrocarbon group with 1 to 12 carbon atoms without an aliphatic unsaturated carbon bond. However, at least two, and preferably at least three $R^4$s in one molecule are hydrogen atoms. From an industrial standpoint, the monovalent hydrocarbon group expressed by $R^4$ is preferably independently a methyl group or a phenyl group.

In the formula, $R^5$ represents a monovalent hydrocarbon group with 1 to 12 carbon atoms without an aliphatic unsaturated carbon bond, and examples include the same groups as the monovalent hydrocarbon group of $R^4$ described above.

Component (C) is preferably an organohydrogenpolysiloxane expressed by the following average compositional formula (2):

$$(HR^6{}_2SiO_{1/2})_e(R^6{}_2SiO_{2/2})_f(SiO_{4/2})_g \quad (2)$$

In formula (2), $R^6$ independently represents an unsubstituted or substituted monovalent hydrocarbon group that does not contain an aliphatic unsaturated bond with 1 to 12 carbon atoms, and e, f, and g represent numbers that satisfy conditions of $0.01 \leq e \leq 0.6$, $0 \leq f \leq 0.9$, $0.2 \leq g \leq 0.9$, and $e+f+g=1$.

Specific examples of the monovalent hydrocarbon group include the same as those indicated as specific examples of the monovalent hydrocarbon group expressed by $R^4$ in average compositional formula (1) above. $R^6$ preferably independently represents a group selected from methyl groups and phenyl groups.

Furthermore, component (C) is preferably an organohydrogenpolysiloxane expressed by the following average compositional formula (3):

$$(HR^7{}_2SiO_{1/2})_h(R^7{}_2SiO_{2/2})_i(R^8SiO_{3/2})_j \quad (3)$$

In formula (3), $R^7$ and $R^8$ each independently represent an unsubstituted or substituted monovalent hydrocarbon group that does not contain an aliphatic unsaturated bond with 1 to 12 carbon atoms, at least 10 mol % of all $R^8$s represent aryl groups, and h, i, and j represent numbers that satisfy conditions of $0.01 \leq h \leq 0.6$, $0 \leq i \leq 0.9$, $0.2 \leq j \leq 0.9$, and $h+i+j=1$.

Specific examples of the monovalent hydrocarbon group include the same as those indicated as specific examples of the monovalent hydrocarbon group expressed by $R^4$ in average compositional formula (1) above. $R^8$ preferably independently represents a group selected from methyl groups and phenyl groups, provided that at least 10 mol % of all $R^8$s are phenyl groups.

The organohydrogenpolysiloxane expressed by the average compositional formula (2) above and the organohydrogenpolysiloxane expressed by the average compositional formula (3) may be used independently or in combination.

The amount of the organohydrogenpolysiloxane of component (C) in the curable silicone composition of the present invention is an amount sufficient to cure the curable silicone composition. For the curing reactive functional groups (such as vinyl groups or other alkenyl groups) containing a carbon-carbon double bond in component (A) and component (B), the amount of hydrogen atoms bonded to silicon atoms in the organohydrogenpolysiloxane of component (C) is an amount where the number of hydrogen atoms bonded to silicon atoms per one alkenyl group for alkenyl groups bonded to silicon atoms included in the entire curable silicone composition is 0.5 to 20.0, and particularly preferably within a range of 1.0 to 10.

(Component (D))

Component (D) is a hydrosilylation reaction catalyst. In particular, 1,3-divinyl-1,1,3,3-tetramethyldisiloxane is preferably used as a hydrosilylation reaction catalyst due to the favorable stability of a platinum-alkenylsiloxane complex thereof, and is preferably added to another component forming the curable silicone composition in the form of an alkenylsiloxane solution of the complex.

The amount of the hydrosilylation reaction catalyst added as component (D) is not particularly limited so long as the amount is such that curing is possible within a target time under conditions of curing the curable silicone composition of the present invention. In general, if the hydrosilylation catalyst is a metal compound such as platinum or the like, the amount of metal atoms is preferably within a range of 0.01 to 100 ppm, 0.01 to 50 ppm, or 0.01 to 10 ppm in mass units relative to the entire composition.

(Component (E))

In addition to the components (A) to (D) above, the curable silicone composition of the present invention may further contain a curing retarder (E).

The structure of the curing retarder is not particularly limited, but the boiling point thereof is preferably 200° C. or higher under atmospheric pressure. This is because if a compound with a low boiling point is used as a delayed curing agent when melting and mixing raw materials under reduced pressure in a production of the curable silicone composition sheet described below, a portion or all of the curing retarder may volatilize during the melt-kneading process, and thus a targeted cure delaying effect for the curable silicone composition may not be achieved. The amount of the curing retarder in the curable silicone composition is not particularly limited, but is preferably within a range of 10 to 10,000 ppm in mass units, with regard to the composition.

[Other Additives]

In addition to the component described above, a material conventionally known in the art may be added to the curable hot-melt silicone composition of the present invention as an additive that may be used in a silicone composition, and examples of additives that may be used include, but are not limited to, to those described below.

A filler can be used as an additive to improve the mechanical properties of a cured product obtained from the curable hot-melt silicone composition of the present invention, to improve flame retardancy, or the like. Examples of fillers include inorganic fillers, organic fillers, and mixtures thereof. From the standpoint of filler function, one or more fillers selected from reinforcing fillers, thermally conductive fillers, pigments (particularly, white pigments), phosphors, and the like may be added to the curable hot-melt silicone composition of the present invention. When a filler is used, the type and amount of the filler is preferably selected and used within a range in which the curable hot-melt silicone composition of the present invention can be melt-kneaded and within a range in which the effect on properties (such as curing properties, mechanical properties after curing, weather resistance, and the like) provided by the curable hot-melt silicone composition of the present invention is acceptable. In one preferred aspect of the curable hot-melt silicone composition of the present invention, the curable hot-melt silicone composition does not contain a filler.

The composition of the present invention may contain an adhesion imparting agent as another optional component so long as an object of the present invention is not impaired.

Furthermore, the composition may contain, as other optional components, heat resistance agents such as iron oxide (red iron oxide), cerium oxide, cerium dimethyl silanolate, fatty acid cerium salt, cerium hydroxide, zirconium compound, and the like, with dyes, pigments other than white, flame retardant agents, and the like capable of being contained as long as the purpose of the present invention is not impaired.

The curable hot-melt silicone composition of the present invention may be used in the form of granules, pellets, sheets, films, or the like. For example, a sheet or film containing the curable silicone composition of the present invention having an average thickness of 10 to 1,000 μm has hot-melt properties and has heat curability under high temperatures. Therefore, the sheet or film has excellent handling workability and melting properties, and is particularly advantageous for use in compression molding or the like. In this case, the composition containing all of components (A) to (D), including component (D), is preferably molded into a sheet or film.

Such a sheet- or film-like composition can be formed into a uniform mixture of all components using a uniaxial or biaxial continuous kneader, and then the mixture can be passed through two rollers or the like and molded into a sheet or film of a prescribed thickness. Furthermore, once the aforementioned granular curable hot-melt silicone composition is obtained, and after adding component (D) if necessary, the mixture may be kneaded in a kneader to make homogeneous and then passed through a molding machine such as two rollers or the like to manufacture a sheet or film adjusted to a prescribed thickness.

The sheet- or film-like composition may be manufactured using fine organopolysiloxane resin particles as a raw material (Method A) or may be manufactured using a hot-melt solid fraction, which is obtained by dispersing an organopolysiloxane resin that is a solid at room temperature and optionally a chain diorganopolysiloxane in an organic solvent and then removing the organic solvent, as a raw material (hot bulk method) (Method B).

With respect to these manufacturing methods, the present applicants have proposed the entire process for manufacturing the curable silicone sheet and the manufacturing apparatus used therewith in JP 2019-167832 and JP 2019-167833, and their priority claim applications to Japan. In the present invention, the method and the manufacturing apparatus can also be applied in making a sheet or a film of the curable hot-melt silicone composition.

[Laminate Body Containing Curable Hot-Melt Silicone Composition and Use Thereof as Film Adhesive]

The present curable hot-melt silicone composition can be used in a sheet or film form, and can be particularly used as a laminate body having a structure in which a sheet-like material containing the curable hot-melt silicone composition described above is interposed between two film-like substrates provided with a release layer. The film-like substrate provided with the release layer (generally referred to as release film) can be released from the sheet-like material containing the curable hot-melt silicone composition when the sheet-like material is used as an adhesive, sealing agent, or the like. The laminate body is also referred to as a releasable laminate body below.

The method of manufacturing the releasable laminate body described above is not particularly limited, and one example includes a method including:

step 1: a step mixing components of the curable hot-melt silicone composition described above;

step 2: a step of kneading the mixture obtained in step 1 while heating and melting;

step 3: a step of laminating the mixture after heating and melting in step 2 between two release films provided with at least one release surface, such that the mixture contacts the release surface, to form a laminate body; and step 4: a step of pressing the laminate body obtained in step 3 between rollers and rolling the mixture interposed between the two release films to form a curable hot-melt silicone composition sheet or film having a specific thickness.

Furthermore, rollers with a cooling or temperature adjusting function may be optionally used in step 4. Furthermore, a step of cutting a resulting laminate body containing the curable hot-melt silicone composition sheet or film may be added after step 4.

Note that the thickness of the release film is not particularly limited, and therefore, in addition to those generally referred to as a film, those referred to as a sheet are also included. However, in the present specification, it is referred to as a release film regardless of the thickness thereof.

[Method of Manufacturing Curable Hot-Melt Silicone Composition]

The present composition may be manufactured by powder-mixing components (A) to (D) and, in some cases, another optional component, such as component (E), at a temperature of less than 50° C., further heating and melting to uniformly mix each component, and then cooling as necessary. However, the composition is not limited to this method and may be manufactured by an arbitrary method. A powder mixer that can be used in the present manufacturing method is not particularly limited, and examples can include a single-shaft or double-shaft continuous mixer, a two-roll mixer, a Ross mixer, a Hobart mixer, a dental mixer, a planetary mixer, a kneader mixer, a laboratory mill, a small grinder, and a Henschel mixer. The laboratory miller and Henschel mixer are preferred.

[Manufacturing Method of Curable Hot-Melt Silicone Composition Sheet or Film]

The curable hot-melt silicone composition of the present invention may have any shape, but one preferred aspect is in a sheet or film shape containing an uncured composition.

As described above, the curable silicone composition sheet or film according to the present invention (hereinafter, sheet and film are collectively referred to as a curable silicone composition sheet for simplicity, in which case "sheet" also includes film) has hot-melt properties and contains the aforementioned components (A), (B), (C), and (D) as essential components. In one aspect, the method of manufacturing a sheet containing a curable hot-melt silicone composition of the present invention includes the following steps 1 to 4.

Step 1: a step of mixing components of the curable hot-melt silicone composition, preferably at a temperature of 50° C. or higher;

Step 2: a step of kneading the mixture obtained in step 1 while heating and melting;

Step 3: a step of laminating the mixture after heating and melting in step 2 between two release films provided with at least one release surface, such that the mixture contacts the release surface, to form a laminate body; and Step 4: a step of pressing the laminate body obtained in step 3 between rollers to mold a curable hot-melt silicone sheet having a specific thickness.

[Laminate Body]

The laminate body obtained from the process described above is a laminate body having an essentially flat curable hot-melt silicone composition sheet with a thickness of 10 to 2000 μm, containing components (A) to (D) described above as essential components and component (E) as an optional component, provided in a structure laminated between two release films including at least one release surface. Note that the release films are preferably provided as a surface structure with enhanced releasability or a surface-treated release surface.

[Curable Hot-Melt Silicone Composition Sheet]

The curable hot-melt silicone composition sheet obtained by the manufacturing method of the present invention is a curable silicone composition containing components (A) to (D) and, in some cases, component (E) described above, and has hot-melt properties. The curable hot-melt silicone composition sheet of the present invention can be used as a pressure sensitive adhesive material, sealing agent, and/or adhesive, or the like, having heat-melting properties. In particular, the curable hot-melt silicone composition sheet has excellent moldability, gap filling properties, and pressure sensitive adhesive force, and can be used as a die attach film or film adhesive. Furthermore, the sheet can also be suitably used as a compression molding or press molding curable hot-melt silicone composition sheet.

Specifically, the curable hot-melt silicone composition sheet obtained by the manufacturing method of the present invention may release the release film, and then be disposed at a desired site such as a semiconductor or the like. Subsequently, a film adhesive layer utilizing gap filling properties with regard to protrusions and recesses or gaps may be formed on and between adherends, followed by being temporarily secured, disposed, and applied together between the adherends. Furthermore, the curable hot-melt silicone composition layer can be cured by heating to 150° C. or higher and a cured product of the curable silicone sheet can be formed between the adherends to adhere the adherends. Note that the release film may be released after the curable hot-melt silicone composition sheet is heated to form a cured product, and a timing for releasing the release film from the curable silicone composition or cured product obtained therefrom may be selected based on an application and method of use of the curable silicone composition sheet.

The curable silicone composition sheet has hot-melt properties, and therefore, it is possible to soften or fluidize the sheet by heating the sheet prior to final curing, and for example, thereby forming an adhesive surface with an adherend by filling protrusions and recesses or gaps without a void even if there are irregularities on the adhesive surface of the adherend. Examples of heating means of the curable hot-melt silicone composition sheet that can be used include various thermostatic baths, hot plates, electromagnetic heating devices, heating rollers, and the like. In order to more efficiently adhere the adherend and curable silicone composition sheet together and heat the curable silicone composition, an electric heating press, a diaphragm type laminator, a roll laminator, or the like is preferably used, for example.

[Curing Conditions of Composition]

The curable hot-melt silicone composition of the present invention is cured by leaving to stand at room temperature or by heating. When curing in a mold based on a molding process or the like, the production cycle time is improved by heating to 150° C. or higher for a short period of time for temporary curing. An uncured curable hot-melt silicone composition, the curable hot-melt silicone composition sheet temporarily pressure bonded to a substrate, and a cured product obtained by temporarily curing the curable hot-melt silicone composition after applying to the substrate are all preferably cured at a temperature of 150° C. or higher for at least 1 hour to complete a curing reaction.

[Viscoelastic Properties of Cured Product]

Figure 1:
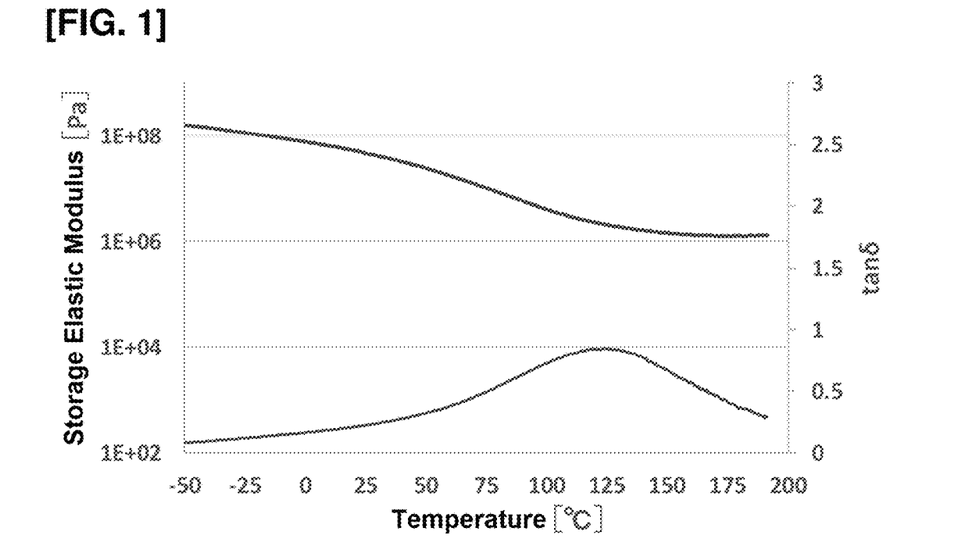

The cured product obtained by curing the curable hot-melt silicone composition of the present invention exhibits characteristic viscoelastic properties. When dynamic viscoelasticity is measured while changing the temperature, general silicone cured products exhibit a sharp glass transition at a certain temperature, depending on the network structure of silicone and the type of functional group. In other words, the curve of tanδ, which is the ratio of storage elastic modulus to loss elastic modulus, has a sharp peak at a certain temperature. In general, the tanδ value being high means that forces applied to the material are dispersed (relieved), and therefore, it can be said that materials with a high tanδ have superior stress relaxation properties. Herein, a cured product containing the composition of the present invention does not exhibit a sharp peak in tanδ at a certain temperature, but exhibits a high tanδ value over a wide temperature range (FIG. 1). For example, if the composition is cured at 150° C., the cured product has a thermal history of a temperature difference of 125° C. before returning to room temperature of 25° C. When performing integral molding with a substrate that has a low coefficient of linear expansion, thermal stress occurs within this temperature range. If tanδ is low over an entire temperature range, or if there is a peak in tanδ within this region but the peak is very sharp, thermal stress continues to accumulate in the material over a specified temperature range, and if tanδ enters a high region and stress relaxation begins, tanδ will quickly move out of the region and sufficient relaxation will not occur. On the other hand, if the tanδ is high over a wide temperature range, as in the cured product obtained by curing the composition of the present invention, the thermal stress relaxes with time, greatly reducing warpage and the like, which occur when using a substrate with a thin thickness. In other words, when a large-area thin substrate is batch sealed using the curable silicone composition sheet containing the composition of the present invention, thermal stress is relieved and warpage and the like are unlikely to occur. This property is manifested when the dynamic viscoelasticity of the cured product exhibits high tanδ over a wide temperature range when measured, and the behavior of tanδ can be controlled by changing the molecular structure and combination ratio of component (A) (or components (A1) and (A2)), component (B), and component (C) to adjust the cross-linking density of the cured product.

[Hardness of Cured Product]

A preferred hardness of the cured product obtained by curing the curable hot-melt silicone composition of the present invention can be classified into two categories depending on an application thereof. When adherends are adhered to both surfaces of the curable hot-melt silicone composition sheet of the present invention, the Type A durometer hardness specified in "Durometer Hardness Test Method for Plastics" of JIS K 7215-1986 is preferably 40 or higher. This is because if the hardness is at or below the lower limit described above, the cured product tends to be too soft and brittle. On the other hand, if the application thereof is substrate sealing, the Type A durometer hardness is preferably 60 or higher. This is because if the hardness is at or below the lower limit described above, the surface of the cured product becomes sticky, and thus handling performance is reduced.

[Use of Cured Product]

An application of the cured product obtained by curing the curable hot-melt silicone composition of the present invention is not particularly limited. The composition of the present invention has hot-melt properties as well as excellent moldability and mechanical properties, and the cured product exhibits the characteristic elastic modulus behavior at room temperature to high temperatures described above. Therefore, the cured product obtained by curing the present composition can be suitably used as a member for a semiconductor device, and can be suitably used as an encapsulant for a semiconductor element, an IC chip or the like, and as an adhesive/bonding member of a conductor device.

A semiconductor device provided with a member containing the cured product obtained by curing the curable silicone composition of the present invention is not particularly limited, but is particularly preferably a light emitting semiconductor device, which is a light emitting/optical device. The cured product of the present invention has excellent coloring resistance at high temperatures, and therefore can be more suitably used as a sealing material used in an optical semiconductor device where transparency is important.

EXAMPLES

The curable hot-melt silicone composition of the present invention and manufacturing method thereof are described below in detail using examples and comparative examples. Note that in the following description, Me, Vi, and Ph in the average unit formula represent methyl, vinyl, and phenyl groups, respectively. Furthermore, the softening point, curability, and storage stability of the of the curable silicone compositions of each example and comparative example were measured by the following methods. The results are shown in Table 1.

[Softening Point]

The curable hot-melt silicone composition was molded into cylindrical pellets of φ14 mm×22 mm. The pellet was placed on a hot plate set at 25° C. to 100° C. and kept pressed from above for 10 seconds with a load of 100 grams, and after the load was removed, the amount of deformation of the pellet was measured. The temperature at which the deformation amount in the height direction was 1 mm or more was defined as the softening point.

[Curing Properties]

The curable silicone composition was vulcanized for 600 seconds at the molding temperature (160° C.) using a curastometer (PREMIER MDR manufactured by Alpha Technologies) in accordance with a method specified in JIS K 6300-2:2001, "Unvulcanized Rubber—Physical Properties—Part 2: Determination of Vulcanization Characteristics Using a Vibratory Vulcanization Tester" to measure the curing properties. Note that for the measurement, a lump of the curable hot-melt silicone composition was weighed out at approximately 5 g, sandwiched between 50 μm-thick PET films, and then placed on a lower die, and measurement started when the upper die closed. The measurements were made using an R-type die for rubber, with an amplitude angle of 0.53°, a vibration frequency of 100 times/minute, and a maximum torque range of 230 kgf-cm. As a result of the measurement, the time (ts-1) required to exceed a torque value of 1 dNm was read in units of seconds.

[Storage Stability]

The curable silicone composition was aged in an oven at 40° C. for one week. The curing properties were then measured using the method described above, and the ts-1 value was read.

Mixtures having the hot-melt properties of organopolysiloxane resin and straight-chain organopolysiloxanes were prepared by the methods indicated in Reference Examples 1 to 7 below, and the heating loss (=mass loss ratio) thereof was evaluated.

Note that in the examples and comparative examples, an environment in which curing inhibition occurs is reproduced by intentionally adding a large amount of a curing retarder.

As a result, if the curable silicone composition does not have sufficient cross-linking performance, the composition does not cure under the prescribed curing conditions.

Reference Example 1

1.37 kg of an organopolysiloxane resin that is a white solid at 25° C., expressed by average unit formula:

$(Me_2ViSiO_{1/2})_{0.05}(Me_3SiO_{1/2})_{0.39}(SiO_{4/2})_{0.56}(HO_{1/2})_{0.02}$ (amount of vinyl group=1.9 mass %) (hereinafter, "Si resin a1"), 5.47 kg of an organopolysiloxane resin that is a white solid at 25° C., expressed by average unit formula:

$(Me_3SiO_{1/2})_{0.44}(SiO_{4/2})_{0.56}(HO_{1/2})_{0.02}$ (amount of vinyl group=0 mass %) (hereinafter, "Si resin a2"), and 2.83 kg of dimethylpolysiloxane blocked at both ends of a molecular chain with a dimethylvinylsiloxy group, expressed by the formula: ViMe$_2$SiO(Me$_2$SiO)$_{800}$SiViMe2 (amount of vinyl group=0.09 mass %) (hereinafter, "Si polymer b")

were dissolved in 4.00 kg of xylene in a pail using a three-one motor. The resulting solution was fed into a twin-screw extruder with the maximum attainable temperature set at 230° C. The xylene and low molecular weight organopolysiloxane components were removed under a vacuum of −0.08 MPa, resulting in a hot-melt transparent mixture 1. The mixture 1 was placed in a pail and cooled to a solid state. The amount of volatile components in this mixture based on conditions of 200° C. for 1 hour were measured and was 0.7 mass %.

Reference Example 2 to 7

Mixtures 2 to 7 were obtained in the same manner as in Reference Example 1, except that the amounts of the Si resin a1, Si resin a2, and Si polymer b above were changed as shown in the table below. The amount of volatile components in the mixtures based on conditions of 200° C. for 1 hour were measured and were all 0.7 mass %.

TABLE 1

| Component (kg) | Reference Example No. | | | | | | |
|---|---|---|---|---|---|---|---|
| | 1 | 2 | 3 | 4 | 5 | 6 | 7 |
| Si resin a1 | 1.37 | 2.40 | 3.09 | 3.76 | 4.44 | 5.15 | 3.25 |
| Si resin a2 | 5.47 | 4.46 | 3.77 | 3.08 | 2.39 | 1.72 | 3.25 |
| Si polymer b | 2.83 | 2.69 | 2.69 | 2.56 | 2.49 | 2.37 | 2.65 |

[Organohydrogenpolysiloxane]

In the following examples and comparative examples, the following organohydrogenpolysiloxanes (SiH siloxanes c1 to c5) were used.

SiH siloxane c1: an organohydrogenpolysiloxane expressed by $(PhSiO_{3/2})_{0.4}(HMe_2SiO_{1/2})_{0.6}$ (amount of volatile components during aging in oven at 100° C. under atmospheric pressure for one hour, in other words, mass loss ratio, of 3.4 mass %)

SiH siloxane c2: an organohydrogenpolysiloxane expressed by $(HMe_2SiO_{1/2})_{0.52}(Me_2SiO_{2/2})_{0.15}(SiO_{4/2})_{0.33}$ (amount of volatile components during aging in oven at 100° C. under atmospheric pressure for one hour, in other words, mass loss ratio, of 2.9 mass %)

SiH siloxane c3: an organohydrogenpolysiloxane expressed by $Me_3SiO(Me_2SiO)_{37}(MeHSiO)_{37}SiMe_3$ (amount of volatile components during aging in oven at 100° C. under atmospheric pressure for one hour, in other words, mass loss ratio, of 2.6 mass %)

SiH siloxane c4: an organohydrogenpolysiloxane expressed by $Me_3SiO(MeHSiO)_7(Me_2SiO)_{6.5}SiMe_3$ (amount of volatile components during aging in oven at 100° C. under atmospheric pressure for one hour, in other words, mass loss ratio, of 12.7 mass %)

SiH siloxane c5: an organohydrogenpolysiloxane expressed by $HMe_2SiO(Me_2SiO)_{17}SiMe_2H$ (amount of volatile components during aging in oven at 100° C. under atmospheric pressure for one hour, in other words, mass loss ratio, of 8.3 mass %)

SiH siloxane c6: an organohydrogenpolysiloxane expressed by $(HMe_2SiO_{1/2})_{0.67}(SiO_{4/2})_{0.33}$ (amount of volatile components during aging in oven at 100° C. under atmospheric pressure for one hour, in other words, mass loss ratio, of 12.8 mass %)

Example 1

Figure 2:
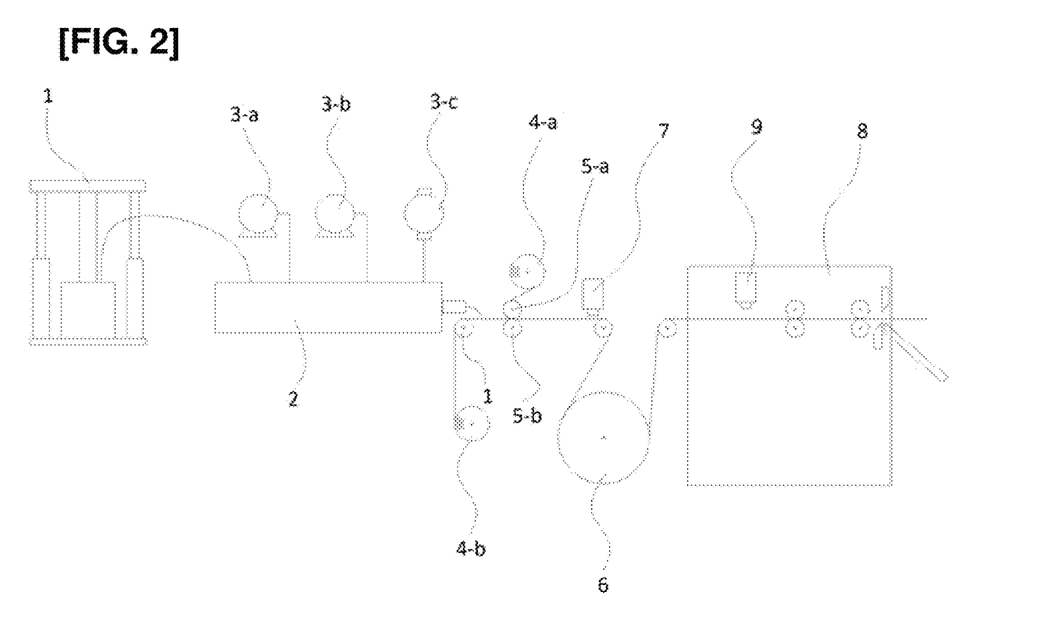

The resulting hot-melt mixture 1 obtained in Reference Example 1 was fed into a twin-screw extruder at 170° C. by a hot-melter (VersaPail Melter manufactured by Nordson) for cylindrical pails at 9.67 kg/hr from a line 1 as illustrated in FIG. 2.

Next, a mixture containing SiH siloxane c1 at 0.176 kg/hr and an amount of methyl tris-1,1-dimethyl-2-propinyloxysilane (boiling point=245° C. (1012.35 hPa)) achieving 3,500 ppm in the present composition was fed through line 3-*a* illustrated in FIG. 2.

The set temperature of the feed section was 150° C.

Then, a mixture containing:

0.15 kg/hr of dimethylpolysiloxane blocked at both ends of a molecular chain with a dimethylvinylsiloxy group expressed by the formula: $ViMe_2SiO(Me_2SiO)_{800}SiViMe_2$ (amount of vinyl groups=0.09 mass %) (="Si polymer b"); and a 1,3-divinyl-tetramethyldisiloxane solution of a 1,3-divinyl-tetramethyldisiloxane platinum complex (at amount where platinum metal is 4.0 ppm in mass units with regard to the present composition as a whole)

were fed from the line 3-*b* as illustrated in FIG. 2 (the set temperature of the feed section was 80° C.), and de-aeration and melt-kneading was performed under a vacuum of −0.08 MPa in the extruder.

The outlet temperature of the twin-screw extruder was set at 80° C. The mixture was in the form of semi-solid softened material. While transporting 330 mm wide and 125-μm-thick release films (FL2-01 manufactured by TAKARA INC. CO. Ltd.) at a rate of 1.0 m/min, the mixture was supplied onto a release film such that the feed rate was 5 kg/hr. The mixture was then interposed between two release films such that a release surface of the release film was in contact with the mixture to form a laminate body (the same applies in the following examples). Subsequently, the laminate body was then pressed between rollers with temperatures controlled at 90° C. to stretch the mixture between the release films to form a laminate body in which a curable hot-melt silicone composition sheet having a thickness of 300 μm was interposed between the two release films. The entire laminate body was then cooled by air cooling. The configuration of the manufacturing device is illustrated in FIG. 3. When the release film was released from the obtained laminate body, a flat, homogeneous, tack-free, transparent curable hot-melt silicone composition sheet without bubbles was obtained, and the softening temperature thereof was 80° C. The curability of the obtained curable hot-melt silicone composition sheet at 160° C. was measured by the method described above, and the ts-1 thereof was 194 seconds. The curable hot-melt silicone composition sheet was aged in an oven at 40° C. for one week, and as a result of measuring the curing properties again, the ts-1 at 160° C. was 190 sec.

The obtained curable hot-melt silicone composition sheet was thermally cured at 160° C. for 2 hours by heat pressing. The obtained cured product was cut into 3 cm×1 cm×0.1 cm pieces. FIG. 1 shows the results obtained by measuring the temperature-dependent viscoelastic properties by a rheometer (MCR-302 manufactured by Anton Paar) at a frequency of 1 Hz within a temperature range of −50° C. to 200° C.

Examples 2 to 8 and Comparative Examples 1 to 4

A flat, homogeneous, tack-free, transparent curable hot-melt silicone composition sheet without bubbles could be obtained in the same manner as Example 1 except that the mixture used in the reference example was used in place of mixture 1 and the SiH siloxane c1 was used as the organohydrogenpolysiloxane (feed amount) shown in the table below. The softening point temperature (° C.) and ts-1 (sec) (initial/40° C.—after 1 week storage) thereof are also shown in the table. Note that Example 8 and Comparative Example 4 were tested using 1-ethynyl-1-cyclohexanol (boiling point=174° C. (1013.25 hPa)) instead of methyltris-1,1-dimethyl-2-propinyloxysilane (boiling point=245° C. (1012.35 hPa)).

TABLE 2

| | Examples | | | | | | | |
|---|---|---|---|---|---|---|---|---|
| | 1 | 2 | 3 | 4 | 5 | 6 | 7 | 8 |
| | Mixture No. | | | | | | | |
| | 1 | 2 | 3 | 4 | 4 | 5 | 6 | 2 |
| SiH siloxane (kg/hr) | | | | | | | | |
| C1 | 0.176 | 0.300 | | 0.45 | | 0.53 | 0.61 | 0.30 |
| C2 | | | 0.29 | | 0.36 | | | |
| Softening point (° C.) | 80 | 85 | 85 | 80 | 80 | 80 | 75 | 85 |
| Ts − 1 (seconds) | | | | | | | | |
| Initial | 194 | 188 | 179 | 173 | 165 | 162 | 155 | 13* |
| 40° C. - 1 week | 190 | 185 | 177 | 170 | 169 | 171 | 148 | — |

| | Examples | | | |
|---|---|---|---|---|
| | 1 | 2 | 3 | 4 |
| | Mixture No. | | | |
| | 1 | 4 | 4 | 7 |
| SiH siloxane (kg/hr) | | | | |
| C1 | | | | |
| C2 | | | | |
| C3 | 0.210 | | | |
| C4 | | | 0.460 | 0.200 |
| C5 | | | | 0.500 |
| C6 | | 0.300 | | |
| Softening point (° C.) | 80 | 80 | 80 | 75 |

TABLE 2-continued

| Ts – 1 (seconds) | | | | |
|---|---|---|---|---|
| Initial | Not observed | 533 | Not observed | 280* |
| 40° C. - 1 week | Not observed | 590 | Not observed | No melting |

*1-ethynyl-1-cyclohexanol used as inhibitor

Comparative Example 5

32.5 g of an organopolysiloxane resin that is a white solid at 25° C., expressed by average unit formula:

$(Me_2ViSiO_{1/2})_{0.05}(Me_3SiO_{1/2})_{0.39}(SO_{4/2})_{0.56}$
$(HO_{1/2})_{0.02}$ (amount of vinyl group=1.9 mass %),
32.5 g of an organopolysiloxane resin that is a white solid at 25° C., expressed by average unit formula:

$(Me_3SiO_{1/2})_{0.44}(SiO_{4/2})_{0.56}(HO_{1/2})_{0.02}$ (amount of vinyl group=0 mass %), and
28.0 g of dimethylpolysiloxane blocked at both ends of a molecular chain with a dimethylvinylsiloxy group, expressed by the formula:

$ViMe_2SiO(Me_2SiO)_{800}SiViMe_2$ (amount of vinyl group=0.09 mass %)
were dissolved in 15 g of xylene in a flask.
2 g of organohydrogenpolysiloxane expressed by the formula:

$Me_3SiO(MeHSiO)_7(Me_2SiO)_{6.5}SiMe_3$ (amount of volatile components during aging in oven at 100° C. at atmospheric pressure for one hour, in other words, mass loss rate, was 12.7 mass %),
5 g of organohydrogenpolysiloxane expressed by the formula:

$HMe_2SiO(Me_2SiO)_{17}SiMe_2H$ (amount of volatile components during aging in oven at 100° C. under atmospheric pressure for one hour, in other words, mass loss ratio, was 8.3 mass %), 1-ethynyl-1-cyclohexanol (boiling point=174° C. (1013.25 hPa)) at an amount equivalent to 500 ppm with regard to the entire present composition, and
a 1,3-divinyl-tetramethyldisiloxane solution of an 1,3-divinyl-tetramethyldisiloxane platinum complex (at an amount where platinum metal is 4.0 ppm in mass units with regard to the entire present composition)
were added to the obtained mixed solution and then mixed in a flask at room temperature to obtain a homogeneous liquid composition.
As a result of applying the obtained mixture onto a PET film at a thickness of 300 μm and then heating at 120° C. for 30 minutes to remove xylene, a film-like composition was obtained. However, the tack thereof was too strong and thus it was difficult to handle. Furthermore, the obtained sheet had a xylene odor, indicating that xylene could not be completely removed by this method.

SUMMARY

For the curable silicone compositions of Examples 1 to 8 according to the present invention, compositions can be obtained that are less susceptible to curing inhibition by using an organohydrogenpolysiloxane with a specific structure. Furthermore, this organohydrogenpolysiloxane has few components that volatilize at 100° C. under atmospheric pressure (particularly under 1 atm). Therefore, in order to prepare the curable silicone composition of the present invention, even if raw materials undergo a melt-kneading process under reduced pressure, active components involved in a hydrosilylation reaction essentially do not volatilize, or if they do, they volatilize in small amounts. Thus, a curable silicone composition with the desired target properties can be obtained. Furthermore, using the curable silicone composition of the present invention could produce a flat, homogeneous, tack-free, transparent, curable hot-melt silicone composition sheet with a thickness of 300 μm and no voids. Furthermore, based on the results of Example 8, by using a curing retarder with a boiling point of 200° C. or higher under atmospheric pressure (particularly under 1 atm), a curable hot-melt silicone composition sheet with favorable storage stability could be obtained without volatilization of the retarder or with very little volatilization, even when melt-kneading of the curable silicone composition was performed under reduced pressure. In contrast, when an organohydrogenpolysiloxane with a large amount of volatile components at 100° C. under atmospheric pressure was used, as in Comparative Examples 1 to 4, active components of the curable silicone composition volatilized beyond the permissible range in the process of melt-kneading the curable silicone composition under reduced pressure. Thus, it was found that the target curing properties of the curable hot-melt silicone composition could not be achieved and that curing of the curable hot-melt silicone composition was significantly slower in the presence of a curing inhibiting material unless the organohydrogenpolysiloxane with the specific structure used in the present invention was used.

REFERENCE NUMERALS

1: Hot-melter
2: Extruder
3-*a*: Pump
3-*b*: Pump
3-*c*: Vacuum pump
4-*a*: Release sheet
4-*b*: Release sheet
5-*a*: Stretching roller (optionally further equipped with a temperature control function)
5-*b*: Stretching roller (optionally further equipped with a temperature control function)
6: Cooling roller
7: Film thickness meter
8: Sheet cutter
9: Foreign material inspecting machine

The invention claimed is:
1. A curable silicone composition having hot-melt properties as a whole, comprising:
   (A) 100 mass parts of an organopolysiloxane resin containing the following component (A1) and component (A2) at a mass ratio of 0:100 to 90:10;
      (A1) an organopolysiloxane resin that is solid at 25° C., having a curing reactive functional group containing a carbon-carbon double bond in a molecule, contain- ing a siloxane unit expressed by $SiO_{4/2}$ making up at least 20 mol % or more of all siloxane units, and not having hot-melt properties alone;
(A2) an organopolysiloxane resin that is solid at 25° C., not having a curing reactive functional group containing a carbon-carbon double bond in a molecule, containing a siloxane unit expressed by $SiO_{4/2}$ making up at least 20 mol % or more of all siloxane units, and not having hot-melt properties alone;
(B) 10 to 100 mass parts of a straight-chain or branched-chain organopolysiloxane that is liquid or has plasticity at 25° C., having a curing reactive functional group containing at least two carbon-carbon double bonds in a molecule;
(C) an organohydrogenpolysiloxane expressed by the following average compositional formula (1):

$$(R^4{}_3SiO_{1/2})_a(R^5{}_2SiO_{2/2})_b(R^5SiO_{3/2})_c(SiO_{4/2})_d \quad (1)$$

where $R^4$ independently represents a hydrogen atom or an unsubstituted or substituted monovalent hydrocarbon group having from 1 to 12 carbon atoms that does not contain an aliphatic unsaturated bond, $R^5$ independently represents an unsubstituted or substituted monovalent hydrocarbon group free from aliphatic unsaturated bonds and with 1 to 12 carbon atoms, at least two of all $R^4$s represent hydrogen atoms, and a, b, c, and d represent numbers that satisfy conditions of $0.01 \leq a \leq 0.6$, $0 \leq b$, $0 \leq c \leq 0.9$, $0 \leq d \leq 0.9$, and $(a+b+c+d)=1$ and $(c+d) \geq 0.2$, and having a mass loss ratio relative to pre-exposure of 10% or less after exposure to 100° C. for 1 hour under atmospheric pressure, at an amount where the number of hydrogen atoms bonded to a silicon atom per alkenyl group bonded to a silicon atom included in the entire curable silicone composition is 0.5 to 20.0; and
(D) a sufficient amount of a hydrosilylation reaction catalyst to crosslink the curable silicone composition.

2. The curable silicone composition according to claim 1, further comprising 1 to 5000 ppm of a curing retarder for a hydrosilylation reaction having a boiling point of 200° C. or higher under atmospheric pressure as component (E), based on the total mass of the composition.

3. The curable silicone composition according to claim 1, wherein the component (C) is an organohydrogenpolysiloxane expressed by the following average compositional formula (2):

$$(HR^6{}_2SiO_{1/2})_e(R^6{}_2SiO_{2/2})_f(SiO_{4/2})_g \quad (2)$$

where $R^6$ independently represents an unsubstituted or substituted monovalent hydrocarbon group that does not contain an aliphatic unsaturated bond with 1 to 12 carbon atoms, and e, f, and g represent numbers that satisfy conditions of $0.01 \leq e \leq 0.6$, $0 \leq f \leq 0.9$, $0.2 \leq g \leq 0.9$, and $e+f+g=1$.

4. The curable silicone composition according to claim 1, wherein the component (C) is an organohydrogensiloxane as expressed by the following average compositional formula (3):

$$(HR^7{}_2SiO_{1/2})_h(R^7{}_2SiO_{2/2})_i(R^8SiO_{3/2})_j \quad (3)$$

where $R^7$ and $R^8$ each independently represent an unsubstituted or substituted monovalent hydrocarbon group that does not contain an aliphatic unsaturated bond with 1 to 12 carbon atoms, at least 10 mol % of all $R^8$s represent aryl groups, and h, i, and j represent numbers that satisfy conditions of $0.01 \leq h \leq 0.6$, $0 \leq i \leq 0.9$, $0.2 \leq j \leq 0.9$, and $(h+i+j)=1$.

5. The curable silicone composition according to claim 1, wherein the component (A1) is (A1-1) an organopolysiloxane resin that does not have hot-melt properties alone, expressed by the following average unit formula:

$$(R^1{}_3SiO_{1/2})_a(R^1{}_2SiO_{2/2})_b(R'SiO_{3/2})_c(SiO_{4/2})_d (R^2O_{1/2})_e$$

where each $R^1$ independently represents a monovalent hydrocarbon group with 1 to 10 carbon atoms, but 1 to 12 mol % of all $R^1$s in a molecule represents an alkenyl group; each $R^2$ represents a hydrogen atom or an alkyl group with 1 to 10 carbon atoms; and a, b, c, d, and e represent numbers that satisfy conditions of $0.10 \leq a \leq 0.60$, $0 \leq b \leq 0.70$, $0 \leq c \leq 0.80$, $0 \leq d \leq 0.65$, $0 \leq e \leq 0.05$, and $(c+d) > 0.20$ and $(a+b+c+d)=1$,
the component (A2) is (A2-1) an organopolysiloxane resin that does not have hot-melt properties alone, expressed by the following average unit formula:

$$(R^3{}_3SiO_{1/2})_f(R^3{}_2SiO_{2/2})_g(R^3SiO_{3/2})_h(SiO_{4/2})_i(R^2O_{1/2})_j$$

where each $R^3$ independently represents a monovalent hydrocarbon group with 1 to 10 carbon atoms and that does not contain a carbon-carbon double bond; $R^2$ represents a hydrogen atom with an alkyl group with 1 to 10 carbon atoms; and f, g, h, i, and j represent numbers that satisfy conditions of $0.35 \leq f \leq 0.55$, $0 \leq g \leq 0.20$, $0 \leq h \leq 0.20$, $0.45 \leq i \leq 0.65$, $0 \leq j \leq 0.05$, and $(f+g+h+i)=1$; and
the component (B) is (B1) a straight-chain diorganopolysiloxane expressed by the following structural formula:

$$R^4{}_3SiO(SiR^4{}_2O)_kSiR^4{}_3{}^4$$

where each $R^4$ independently represents a monovalent hydrocarbon group with 1 to 10 carbon atoms, but at least two of the $R^4$s in one molecule represents an alkenyl group, and k represents a number from 20 to 5,000.

6. A sheet or film comprising the curable silicone composition according to claim 1, which is melt-kneaded under vacuum within a temperature range of 50 to 150° C. and then molded into a sheet or film.

7. The curable silicone composition sheet or film according to claim 6, wherein the thickness is between 10 and 1000 μm.

8. A sheet- or film-like adhesive, comprising the curable silicone composition sheet or film according to claim 6.

9. A sheet- or film-like sealing agent, comprising the curable silicone composition sheet or film according to claim 6.

10. A releasable laminate body, comprising:
the curable silicone composition sheet or film according to claim 6; and
a sheet- or film-like substrate adhered to one or two surfaces of the curable silicone composition sheet or film, and having a release surface facing the curable silicone composition sheet or film;
wherein the curable silicone composition sheet or film can be released from the sheet- or film-like substrate having the release surface.

11. A laminate body, comprising:
a substrate serving as an electronic component or a precursor thereof, and
a curable silicone composition layer formed with at least one surface of the curable silicone composition sheet or film according to claim 6 firmly adhered to a portion or all of a front surface of the substrate;

wherein the curable silicone composition is in an uncured state.

12. A cured product obtained by curing the curable silicone composition according to claim 1.

13. The cured product according to claim 12, as a member for a semiconductor device or a member for an optical semiconductor device.

14. A semiconductor device or an optical semiconductor device, comprising the cured product according to claim 12.

15. A method of manufacturing the laminate body according to claim 11, comprising a step of firmly adhering at least one surface of an uncured curable silicone composition sheet or film to a portion or all of a substrate serving as an electronic component or a precursor thereof, by one or more means selected from vacuum laminators, vacuum presses, and compression molding.

* * * * *